(12) United States Patent
Hong et al.

(10) Patent No.: US 11,962,300 B2
(45) Date of Patent: Apr. 16, 2024

(54) INPUT/OUTPUT CIRCUIT, OPERATION METHOD THEREOF AND DATA PROCESSING SYSTEM INCLUDING THE SAME

(71) Applicant: SK hynix Inc., Icheon-si (KR)

(72) Inventors: Jaehyeong Hong, Icheon-si (KR); Yo Han Jeong, Icheon-si (KR); Jin Ha Hwang, Icheon-si (KR); Junseo Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 552 days.

(21) Appl. No.: 17/160,089

(22) Filed: Jan. 27, 2021

(65) Prior Publication Data
US 2022/0123736 A1   Apr. 21, 2022

(30) Foreign Application Priority Data

Oct. 19, 2020  (KR) ........................ 10-2020-0135353

(51) Int. Cl.
| | | |
|---|---|---|
| G11C 7/00 | (2006.01) | |
| G06F 1/04 | (2006.01) | |
| G06F 1/26 | (2006.01) | |
| H03F 3/45 | (2006.01) | |
| H03K 3/017 | (2006.01) | |
| H03K 3/037 | (2006.01) | |

(52) U.S. Cl.
CPC .............. *H03K 3/017* (2013.01); *G06F 1/04* (2013.01); *G06F 1/26* (2013.01); *H03F 3/45264* (2013.01); *H03K 3/037* (2013.01)

(58) Field of Classification Search
CPC .......... H03K 3/017; H03K 3/037; G06F 1/26; G06F 1/04; H03F 33/45264

USPC ........................................................ 365/203
See application file for complete search history.

(56) References Cited

U.S. PATENT DOCUMENTS

| | | | | |
|---|---|---|---|---|
| 4,743,784 A | * | 5/1988 | Obara .................... | G11C 7/065 327/213 |
| 5,289,419 A | * | 2/1994 | Hashizumi ............ | G11C 11/419 365/207 |
| 5,936,432 A | * | 8/1999 | Oh ......................... | G11C 7/062 327/55 |
| 6,067,256 A | * | 5/2000 | Yamashita ............ | G11C 11/419 365/189.08 |

(Continued)

FOREIGN PATENT DOCUMENTS

KR   1020180116879 A   10/2018

OTHER PUBLICATIONS

Andrea Bandiziol et al., Design of a half-rate receiver for a 10Gbps automotive serial interface with 1-tap-unrolled 4-taps DFE and custom CDR algorithm, 2018 IEEE.

(Continued)

*Primary Examiner* — Viet Q Nguyen
(74) *Attorney, Agent, or Firm* — William Park & Associates Ltd.

(57) ABSTRACT

An input/output circuit may include an input circuit, an amplifier circuit and a precharging circuit. The input circuit may load differential input data to setup nodes based on a data strobe clock. The amplifier circuit may compare and amplify the data that is loaded to the setup nodes and configured to output the amplified data. The precharging circuit may precharge the setup nodes based on the data strobe clock and the differential input data.

18 Claims, 7 Drawing Sheets

(56) References Cited

U.S. PATENT DOCUMENTS

| | | | | |
|---|---|---|---|---|
| 6,144,231 | A * | 11/2000 | Goldblatt | G11C 7/065 327/57 |
| 6,278,298 | B1 * | 8/2001 | Hayakawa | H03K 19/23 326/119 |
| 6,313,696 | B1 * | 11/2001 | Zhang | H03F 3/3028 327/563 |
| 6,594,187 | B2 * | 7/2003 | Ito | G11C 7/12 365/185.24 |
| 7,046,045 | B2 * | 5/2006 | Nakazato | H03F 3/45188 327/55 |
| 7,263,016 | B1 * | 8/2007 | Palumbo | G11C 7/12 365/207 |
| 7,382,172 | B2 * | 6/2008 | Lin | H03K 3/35613 327/333 |
| 7,545,180 | B2 * | 6/2009 | Goel | G11C 7/08 327/52 |
| 7,907,442 | B2 * | 3/2011 | Kitai | G11C 7/065 365/207 |
| 8,570,823 | B2 * | 10/2013 | Chen | G11C 7/065 365/205 |
| 8,890,576 | B2 * | 11/2014 | Kim | G11C 7/1048 327/55 |
| 8,970,256 | B2 * | 3/2015 | Lee | G11C 7/065 327/55 |
| 9,281,055 | B2 * | 3/2016 | Sahu | G11C 11/419 |
| 9,473,139 | B2 * | 10/2016 | Vrudhula | H03K 19/01707 |
| 9,490,815 | B2 * | 11/2016 | Vrudhula | H03K 19/17736 |
| 9,520,882 | B2 | 12/2016 | Hwang | |
| 9,646,658 | B1 * | 5/2017 | Park | G11C 7/106 |
| 9,679,619 | B2 * | 6/2017 | Hsieh | G11C 7/08 |
| 9,793,885 | B2 | 10/2017 | Dai | |
| 10,242,720 | B2 * | 3/2019 | Chen | G11C 7/08 |
| 10,242,740 | B2 * | 3/2019 | Wijnands | H04L 45/74591 |
| 10,535,388 | B1 * | 1/2020 | Ingalls | G11C 7/065 |
| 10,559,346 | B2 * | 2/2020 | Mathews | G11C 11/4091 |
| 10,566,035 | B2 * | 2/2020 | Oak | G11C 7/08 |
| 10,943,644 | B1 * | 3/2021 | Lee | G11C 11/4091 |
| 11,152,055 | B1 * | 10/2021 | Lee | G11C 11/4094 |
| 11,356,100 | B2 * | 6/2022 | Vrudhula | G06F 30/347 |
| 11,450,378 | B2 * | 9/2022 | Sato | G11C 11/4087 |
| 11,501,825 | B2 * | 11/2022 | Sako | G11C 16/24 |
| 2005/0264322 | A1 * | 12/2005 | Nakazato | G11C 7/065 327/51 |
| 2011/0216608 | A1 * | 9/2011 | Hold | G11C 7/10 365/205 |

OTHER PUBLICATIONS

Behzad Razavi, The StrongARM Latch, A Circuit for All Seasons, IEEE Solid-State Circuits Magazine 2015, pp. 12-17.

* cited by examiner

INPUT/OUTPUT CIRCUIT, OPERATION METHOD THEREOF AND DATA PROCESSING SYSTEM INCLUDING THE SAME

CROSS-REFERENCES TO RELATED APPLICATION

The present application claims priority under 35 U.S.C. § 119(a) to Korean application number 10-2020-0135353, filed on Oct. 19, 2020, in the Korean Intellectual Property Office, which is incorporated herein by reference in its entirety.

BACKGROUND

1. Technical Field

Various embodiments generally relate to an input/output circuit, an operation method thereof, and a data processing system including the same, and more particularly, to an input/output circuit that transfers differential input data based on a data strobe clock, an operation method thereof, and a data processing system including the same.

2. Related Art

In general, an integrated circuit, including a semiconductor device and a semiconductor memory device, receives data, performs a preset operation, and outputs the operation result. Therefore, the integrated circuit includes an input/output circuit that is mounted therein, the input/output circuit being configured to receive data or output a result. Such an input/output circuit needs to accurately recognize input data and output the data without losing the data. For this operation, the input/output circuit uses a data strobe clock. That is, the input/output circuit recognizes data or outputs data based on the data strobe clock.

SUMMARY

In an embodiment, an input/output circuit may include: an input circuit configured to load differential input data to setup nodes based on a data strobe clock; an amplifier circuit configured to compare and amplify the data that is loaded to the setup nodes and configured to output the amplified data; and a precharging circuit configured to precharge the setup nodes based on the data strobe clock and the differential input data.

In an embodiment, an operation method of an input/output circuit may include the steps of: precharging a first setup node and a second setup node, to which differential input data is loaded, based on the differential input data during a precharging operation; loading the differential input data to the first and second setup nodes during a loading operation; and comparing and amplifying the data of the first and second setup nodes, and outputting the amplified data, during an output operation.

In an embodiment, a data processing system may include: a host device configured to provide differential input data and data frequency information; and a data processing device configured to input and output the differential input data based on a data strobe clock with a duty rate that corresponds to the data frequency information. The data processing device may include: a clock generation circuit configured to adjust the duty rate of the data strobe clock and generate a final data strobe clock, based on the data frequency information; and an input/output circuit including an input circuit configured to load the differential input data to setup nodes based on the final data strobe clock, an amplifier circuit configured to amplify the data that is loaded to the setup nodes and configured to output the amplified data, and a precharging circuit configured to precharge the setup nodes based on the final data strobe clock and the differential input data.

In an embodiment, an input/output circuit may include: an input circuit configured to load differential input data to setup nodes based on a data strobe clock; an amplifier circuit configured to compare and amplify the differential input data; and a precharging circuit configured to precharge the setup nodes based on the data strobe clock and the differential input data in order to independently control voltage levels of the setup nodes.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless dearly defined in the application.

Various embodiments are directed to an input/output circuit capable of precharging setup nodes based on differential input data.

Also, various embodiments are directed to a data processing system capable of adjusting the duty rate of a data strobe clock according to the frequency at which differential input data are inputted.

Objects of the present disclosure are not limited to the aforementioned objects, and other objects not described above may be evidently understood by those skilled in the art, to which the present disclosure pertains, from the following description.

In accordance with the present embodiments, the input/output circuit, the operation method thereof and the data processing system include the same can process differential input data more quickly and stably, thereby raising the stability of data which are finally outputted.

Effects of the present disclosure are not limited to the aforementioned effects, and other effects not described above may be evidently understood by those skilled in the art, to which the present disclosure pertains, from the above description.

Although various embodiments have been described for illustrative purposes, it will be apparent to those skilled in the art that various changes and modifications may be made without departing from the spirit and scope of the disclosure as defined in the following claims.

Figure 1:
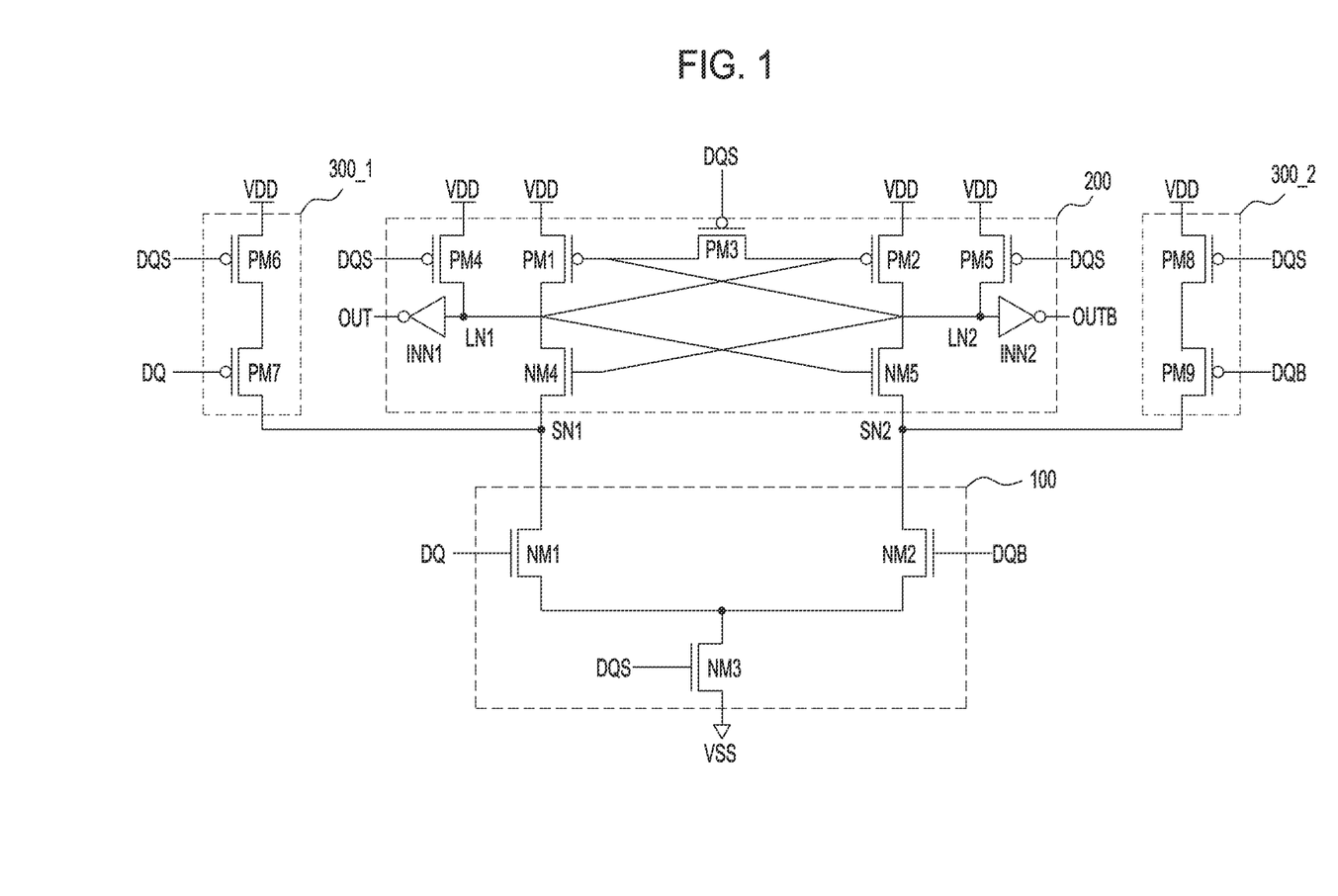
FIG. 1 is a circuit diagram illustrating a configuration of an input/output circuit in accordance with an embodiment.

FIG. 1 is a circuit diagram illustrating a configuration of an input/output circuit in accordance with an embodiment.

Referring to FIG. 1, the input/output circuit may include an input circuit 100, an amplifier circuit 200, and precharging circuits 300_1 and 300_2.

First, the input circuit 100 may be configured to load differential input data DQ and DQB to setup nodes SN1 and SN2 based on a data strobe clock DQS. The data strobe clock DQS may be a clock signal that synchronizes the differential input data DQ and DQB. The data strobe clock DQS may have a duty rate of 50:50. The differential input data DQ and DQB may include a primary input data DQ and a secondary input data DQB. The primary input data DQ and the secondary input data DQB may be exactly out of phase.

More specifically, the input circuit 100 may include first to third NMOS transistors NM1 to NM3.

The first NMOS transistor NM1 may have drain and source terminals that are coupled between the first setup node SN1 and the third NMOS transistor NM3, and the first NMOS transistor NM1 may also have a gate terminal configured to receive the primary input data DQ. The second NMOS transistor NM2 may have drain and source terminals that are coupled between the second setup node SN2 and the third NMOS transistor NM3, and the second NMOS transistor NM2 may also have a gate terminal configured to receive the secondary input data DQB. The third NMOS transistor NM3 may have drain and source terminals that are coupled between a ground voltage terminal VSS and a node to which the first and second NMOS transistors NM1 and NM2 are coupled in common, and the third NMOS transistor NM3 may also have a gate terminal configured to receive the data strobe clock DQS.

Through the above-described configuration, the input circuit 100 may load the primary/secondary input data DQ and DQB to the first and second setup nodes SN1 and SN2, respectively, while the data strobe clock DQS is logic 'high'. In other words, when the primary input data DQ changes to logic 'high' while the data strobe clock DQS is logic 'high', the voltage level of the first setup node SN1 of the input circuit 100 may be lowered. This state may indicate that the primary input data DQ has been loaded to the first setup node SN1. When the secondary input data DQB changes to logic 'high' while the data strobe clock DQS is logic 'high', the voltage level of the second setup node SN2 of the input circuit 100 may be lowered. This state may indicate that the secondary input data DQB has been loaded to the second setup node SN2.

The amplifier circuit 200 may be configured to compare and amplify the data that is loaded to the first and second setup nodes SN1 and SN2 and may be configured to output the amplified data. The amplifier circuit 200 may compare and amplify the voltage levels of the first and second setup nodes SN1 and SN2, The amplifier circuit 200 may output the amplified data as a primary output signal OUT and a secondary output signal OUTB.

More specifically, the amplifier circuit 200 may include first to third PMOS transistors PM1 to PM3, fourth and fifth NMOS transistors NM4 and NM5, fourth and fifth PMOS transistors PM4 and PM5, and first and second inverters INV1 and INV2.

The first PMOS transistor PM1 may have source and drain terminals that are coupled between a supply voltage terminal VDD and a first amplification node LN1, and the second PMOS transistor PM2 may have source and drain terminals that are coupled between the supply voltage terminal VDD and a second amplification node LN2. The third PMOS transistor PM3 may have source and drain terminals that are coupled between a gate terminal of the first PMOS transistor PM1 and a gate terminal of the second PMOS transistor PM2, and the third PMOS transistor PM3 may also have a gate terminal configured to receive the data strobe clock DQS. The fourth NMOS transistor NM4 may have drain and source terminals that are coupled between the first amplification node LN1 and the first setup node SN1, and the fifth NMOS transistor NM5 may have drain and source terminals that are coupled between the second amplification node LN2 and the second setup node SN2. The gate terminals of the first and second PMOS transistors PM1 and PM2 and the gate terminals of the fourth and fifth NMOS transistors NM4 and NM5 may be coupled in a cross-couple type.

The fourth PMOS transistor PM4 may have source and drain terminals that are coupled between the supply voltage terminal VDD and the first amplification node LN1, and the fourth PMOS transistor PM4 may also have a gate terminal configured to receive the data strobe clock DQS. The fifth PMOS transistor PM5 may have source and drain terminals that are coupled between the supply voltage terminal VDD and the second amplification node LN2, and the fifth PMOS transistor PM5 may also have a gate terminal configured to receive the data strobe clock DQS. The first inverter INV1 may receive a signal that is transferred to the first amplification node LN1, invert the received signal, and output the inverted signal as the primary output signal OUT. Similarly, the second inverter INV2 may receive a signal that is transferred to the second amplification node LN2, invert the received signal, and output the inverted signal as the secondary output signal OUTB.

Hereafter, a circuit operation of the amplifier circuit 200 is will be briefly described.

When the data strobe clock DQS changes to logic 'low', the third to fifth PMOS transistors PM3 to PM5 may be turned on, and the first and second amplification nodes LN1 and LN2 may be initialized to a voltage level that corresponds to the supply voltage terminal VDD. The initialization may indicate that the amplifier circuit 200 is set in a standby state for the comparison and amplification operations. Then, when the data strobe clock DQS changes to logic 'high', the third to fifth PMOS transistors PM3 to PM5 may be turned off. The first and second amplification nodes LN1 and LN2 may have a voltage difference that occurs based on the voltage levels of the first and second setup nodes SN1 and SN2. Therefore, the first and second PMOS transistors PM1 and PM2 and the fourth and fifth NMOS transistors NM4 and NM5, which are coupled in a cross-couple type, may amplify the voltage levels of the first and second amplification nodes LN1 and LN2. The first inverter INV1 may output the primary output signal OUT that corresponds to the voltage level of the first amplification node LN1, and the second inverter INV2 may output the secondary output signal OUTB that corresponds to the voltage level of the second amplification node LN2.

Through the above-described configuration, the amplifier circuit 200 may compare and amplify the data that is loaded to the first and second setup nodes SN1 and SN2. The amplifier circuit 200 may output the amplified data as the primary output signal OUT and the secondary output signal OUTB.

The precharging circuits 300_1 and 300_2 may be configured to precharge the first and second setup nodes SN1 and SN2, based on the data strobe clock DQS and the primary/secondary input data DQ and DQB, which are differential input data. The precharging circuits 300_1 and 300_2 may include a first precharging circuit 300_1 that is coupled to the first setup node SN1 and a second precharging circuit 300_2 that is coupled to the second setup node SN2.

First, the first precharging circuit 300_1 may be configured to precharge the first setup node SN1 based on the data strobe clock DQS and the primary input data DQ.

More specifically, the first precharging circuit 300_1 may include sixth and seventh PMOS transistors PM6 and PM7. The sixth and seventh PMOS transistors PM6 and PM7 may be coupled in series between the supply voltage terminal VDD and the first setup node SN1. The sixth PMOS transistor PM6 may have a gate terminal configured to receive the data strobe clock DQS, and the seventh PMOS transistor PM7 may have a gate terminal configured to receive the primary input data DQ. Thus, for example, when the data strobe clock DQS and the primary input data DQ change to logic 'low', the first setup node SN1 may be precharged with a voltage level that corresponds to the supply voltage terminal VDD. The sixth and seventh PMOS transistors PM6 and PM7 may be designed to have lower drivability than the first and second NMOS transistors NM1 and NM2.

The second precharging circuit 300_2 may be configured to precharge the second setup node SN2 based on the data strobe clock DQS and the secondary input data DQB.

More specifically, the second precharging circuit 300_2 may include eighth and ninth PMOS transistors PM8 and PM9. The eighth and ninth PMOS transistor PM8 and PM9 may be coupled in series between the supply voltage terminal VDD and the second setup node SN2. The eighth PMOS transistor PM8 may have a gate terminal configured to receive the data strobe clock DQS, and the ninth PMOS transistor PM9 may have a gate terminal configured to receive the secondary input data DQB. Thus, for example, when the data strobe clock DQS and the secondary input data DQB change to logic 'low', the second setup node SN2 may be precharged with a voltage level that corresponds to the supply voltage terminal VDD. The eighth and ninth PMOS transistors PM8 and PM9 may be designed to have lower drivability than the first and second NMOS transistors NM1 and NM2.

Through the above-described configuration, the first precharging circuit 300_1 may be configured to precharge the first setup node SN1 based on the data strobe clock DQS and the primary input data DQ. The second precharging circuit 300_2 may precharge the second setup node SN2 based on the data strobe clock DQS and the secondary input data DQB.

In short, the input circuit 100 may receive the primary input data DQ and the secondary input data DQB in a time interval in which the data strobe clock DQS is logic 'high' and may perform a loading operation. The precharging circuits 300_1 and 300_2 may precharge the first and second setup nodes SN1 and SN2, based on the primary/secondary input data DQ and DQB, respectively, in a time interval in which the data strobe clock DQS is logic 'low'. Specifically, the first precharging circuit 300_1 may precharge the first setup node SN1 based on the primary input data DQ. The second precharging circuit 300_2 may precharge the second setup node SN2 based on the secondary input data DQB. The precharging operation may be performed before the loading operation.

The input/output circuit, in accordance with the present embodiment, may independently control the voltage levels of the first and second setup nodes SN1 and SN2 through the precharging operation. In other words, the precharging operation may allow for the voltage level that is applied to the first setup node SN1 to be different from the voltage level that is applied to the second setup node SN2. Therefore, the input/output circuit may more quickly perform the comparison and amplification operations on the differential input data DQ and DQS.

Figure 2:
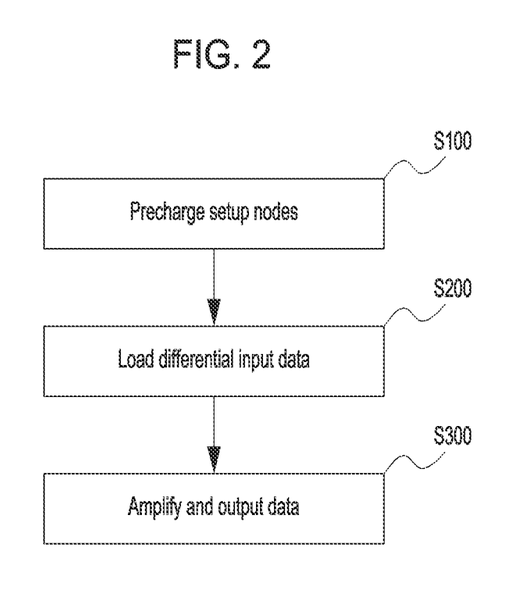
FIG. 2 is a flowchart illustrating a circuit operation of the input/output circuit of FIG. 1.

FIG. 2 is a flowchart illustrating a circuit operation of the input/output circuit of FIG. 1.

Referring to FIGS. 1 and 2, the circuit operation of the input/output circuit may include step S100 of precharging setup nodes, step S200 of loading differential input data, and step S300 of amplifying and outputting data.

Step S100 of precharging the setup nodes may include precharging the first and second setup nodes SN1 and SN2 to which the primary input data DQ and the secondary input data DQB are loaded as the differential input data DQ and DQB during a precharging operation. As described with reference to FIG. 1, the precharging circuits 300_1 and 300_2 may perform the precharging operation in a time interval in which the data strobe clock DQS is logic 'low'. That is, the first precharging circuit 300_1 may precharge the first setup node SN1 based on the primary input data DQ during the precharging operation. The second precharging circuit 300_2 may precharge the second setup node SN2 based on the second input data DOB. Through the precharging operation, the voltage levels of the first and second setup nodes SN1 and SN2 may be independently controlled.

Step S200 of loading the differential input data may include loading the differential input data DQ and DQB to the first and second setup nodes SN1 and SN2 during a loading operation. As described with reference to FIG. 1, the input circuit 100 may perform the loading operation in a time interval in which the data strobe clock DOS is logic 'high'. That is, the voltage level of the first setup node SN1 may be lowered based on the logic 'high' primary input data DQ, during the loading operation. Furthermore, the voltage level of the second setup node SN2 may be lowered based on the logic 'high' secondary input data DQB.

Step S300 of amplifying and outputting the data may include comparing and amplifying the data of the first and second setup nodes SN1 and SN2 and outputting the amplified data, during an output operation. As described above with reference to FIG. 1, the amplifier circuit 200 may compare and amplify the data that is loaded to the first and second setup nodes SN1 and SN2, and output the amplified data as the primary output signal OUT and the secondary output signal OUTB.

The input/output circuit, in accordance with the present embodiment, may independently control the voltage levels of the first and second setup nodes SN1 and SN2 through the precharging operation. Thus, the input/output circuit can perform the comparison and amplification operations more quickly during the output operation. When the input/output circuit can perform the comparison and amplification operations more quickly, it may indicate that the input/output circuit can process the differential input data DQ and DQB more quickly and stably.

Figure 3:
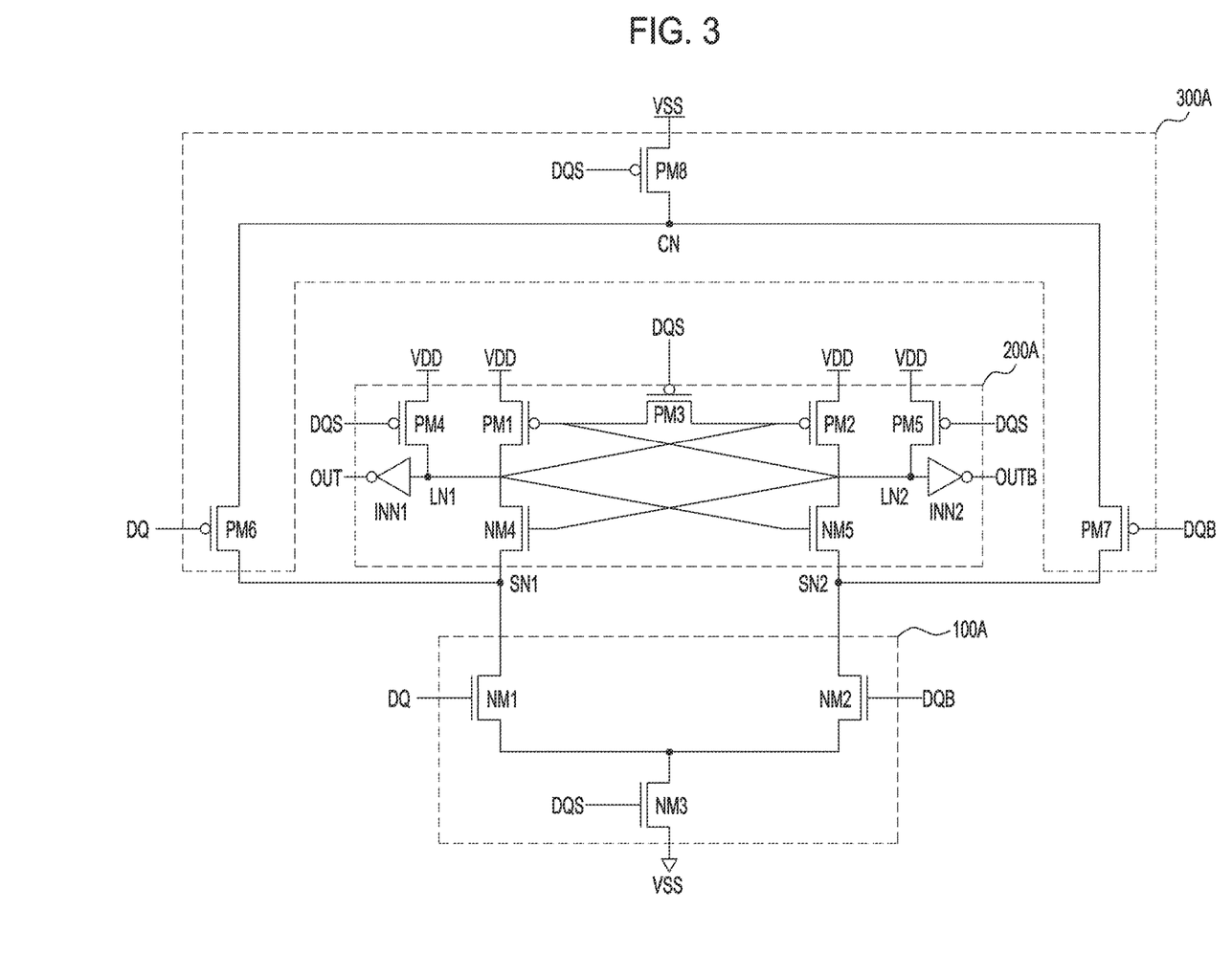
FIG. 3 is a circuit diagram illustrating a configuration of an input/output circuit in accordance with an embodiment.

FIG. 3 is a circuit diagram illustrating a configuration of an input/output circuit in accordance with an embodiment.

Referring to FIG. 3, the input/output circuit may include an input circuit 100A, an amplifier circuit 200A, and a precharging circuit 300A. Since the input circuit 100A and the amplifier circuit 200A of FIG. 3 correspond to the input circuit 100 and the amplifier circuit 200 of FIG. 1, respectively, the detailed descriptions of the circuit configuration and operation thereof will be omitted herein. Hereafter, the precharging circuit 300A, compared to the is configuration of FIG. 1, will be described.

The precharging circuit 300A may be configured to precharge the first and second setup nodes SN1 and SN2, based on the data strobe clock DQS and the primary/secondary input data DQ and DQB, which are differential input data.

More specifically, the precharging circuit 300A may include sixth to eighth PMOS transistors PM6 to PM8.

Specifically, the sixth PMOS transistor PM6 may be defined as a first precharging circuit that precharges the first setup node SN1 based on the primary input data DQ. The sixth PMOS transistor PM6 may have source and drain terminals that are coupled between the first setup node SN1 and the eighth PMOS transistor PM8, which will be described below. The sixth PMOS transistor PM6 may also have a gate terminal configured to receive the primary input data DQ. The seventh PMOS transistor PM7 may be defined as a second precharging circuit that precharges the second setup node SN2 based on the secondary input data DQB. The seventh PMOS transistor PM7 may have source and drain terminals coupled between the eighth PMOS transistor PM8 and the second setup node SN2, and the seventh PMOS transistor PM7 may also have a gate terminal to configured to receive the secondary input data DQB. The eighth PMOS transistor PM8 may be defined as a voltage supply circuit that provides a precharging voltage to the sixth and seventh PMOS transistors PM6 and PM7, based on the data strobe clock DQS. The eighth PMOS transistor PM8 may be commonly coupled to the sixth and seventh PMOS transistors PM6 and PM7. The eighth PMOS transistor PM8 may have source and drain terminals that are coupled between the supply voltage terminal VDD and a common node CN, and the eighth PMOS transistor PM8 may also have a gate terminal configured to receive the data strobe clock DQS. The common node CN may be commonly coupled to the source terminal of the sixth PMOS transistor PM6 and the source terminal of the seventh PMOS transistor PM7.

Hereafter, a circuit operation of the precharging circuit 300A will be briefly described.

When the data strobe clock DQS changes to logic 'low', the eighth PMOS transistor PM8 may be turned on, and the sixth and seventh PMOS transistors PM6 and PM7 may receive the precharging voltage that corresponds to the supply voltage terminal VDD. At this time, when the primary input data DQ is logic 'low', the sixth PMOS transistor PM6 may precharge the first setup node SN1 with the precharging voltage. When the secondary input data DQB is logic 'low', the seventh PMOS transistor PM7 may precharge the second setup node SN2 with the precharging voltage.

The input/output circuit, in accordance with the present embodiment, may include the eighth PMOS transistor PM8 that serves as one voltage supply circuit, which can provide the precharging voltage to the sixth PMOS transistor PM6 that serves as the first precharging circuit and the seventh PMOS transistor PM7 that serves as the second precharging circuit. Therefore, the input/output circuit may constitute one voltage supply circuit to minimize the area of the input/output circuit. The sixth and seventh PMOS transistors PM6 and PM7 may receive the same precharging voltage. That is, the first and second setup nodes SN1 and SN2 may receive the precharging voltage into which the same noise is reflected. Therefore, during the precharging operation, it is possible to minimize the influence of noise that is reflected into the first and second setup nodes SN1 and SN2.

Figure 4:
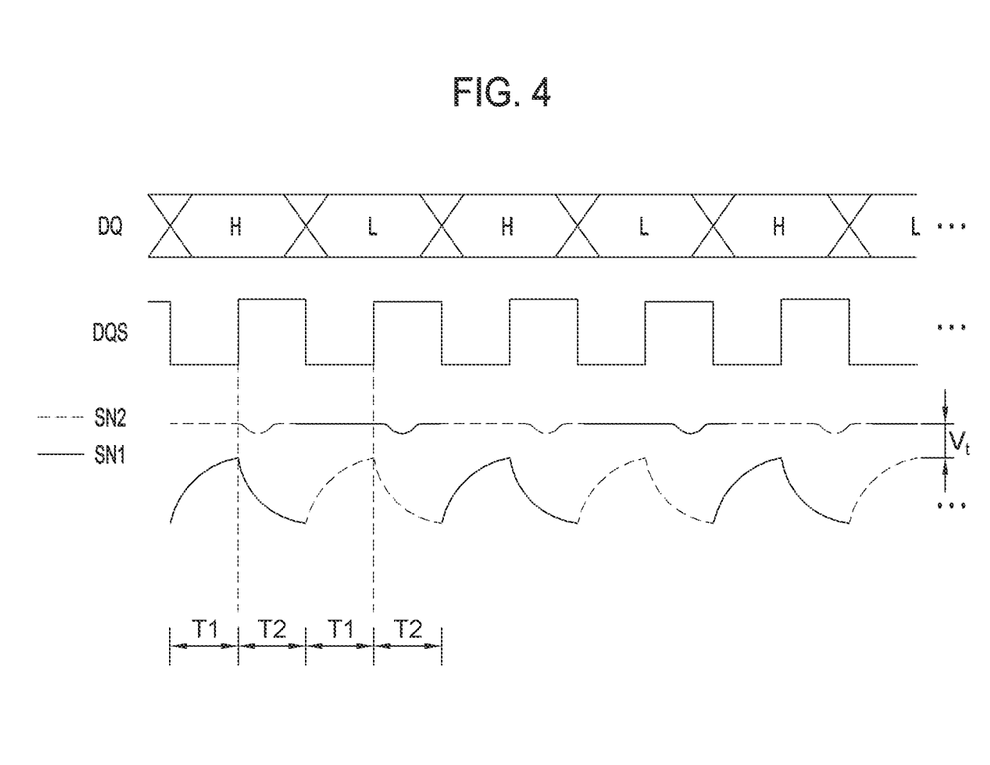
FIG. 4 is a timing diagram illustrating operation timings of the input/output circuits of FIGS. 1 and 3.

FIG. 4 is a timing diagram illustrating operation timings of the input/output circuits of FIGS. 1 and 3.

FIG. 4 illustrates operation waveforms of the primary input data DQ, the data strobe clock DQS, the first setup node SN1, and the second setup node SN2. Hereafter, for convenience of description, the time interval in which the data strobe clock DQS is logic 'low' is defined as "precharging operation time interval T1". Furthermore, the time interval in which the data strobe clock DQS is logic 'high' is defined as "loading and output operation time interval T2".

For reference, since the input/output circuit of FIG. 1 and the input/output circuit of FIG. 3 have similar operation timings, the input/output circuit of FIG. 1 will be taken as an example for description.

Referring to FIGS. 1 and 3, the primary input data DQ may change to logic 'high' or logic 'low'. Although not illustrated in the drawing, the secondary input data DQB and the primary input data DQ may be exactly out of phase as described above.

First, the case in which the primary input data DQ is logic 'high' and the secondary input data DQB is logic 'low' will be described.

In the precharging operation time interval T1, the second setup node SN2 may be precharged based on the logic 'low' secondary input data DQB. At this time, the voltage level of the first setup node SN1 may be gradually raised by the initialization of the first amplification node LN1. The voltage levels of the first and second setup nodes SN1 and SN2 have a difference that corresponds to a threshold voltage value Vt of the fourth NMOS transistor NM4. That is, the voltage level of the second setup node SN2 may be higher than the voltage level of the first setup node SN1.

Then, in the loading and output operation time interval T2, the first NMOS transistor NM1 may be turned on based on the logic 'high' primary input data DQ. Since the voltage level of the second setup node SN2 is higher than the voltage level of the first setup node SN1 in the precharging operation time interval T1, the comparison and amplification operations of the amplifier circuit 200 may be performed quickly. That is, the voltage level of the first setup node SN1 may be lowered more quickly based on the logic 'high' primary input data DQ.

The case in which the primary input data DQ is logic 'low' and the secondary input data DQB is logic 'high' will be described.

In the precharging operation time interval T1, the first setup node SN1 may be precharged based on the logic 'low' primary input data DQ. Therefore, the voltage level of the first setup node SN1 may be higher than the voltage level of the second setup node SN2. Then, in the loading and output operation time interval T2, the second NMOS transistor NM2 may be turned on based on the logic 'high' secondary input data DQB. Since the voltage level of the first setup node SN1 is higher than the voltage level of the second setup node SN2 in the precharging operation time interval T1, the comparison and amplification operations of the amplifier circuit 200 may be performed quickly. That is, the voltage level of the second setup node SN2 may be lowered more quickly based on the logic 'high' secondary input data DQB.

The input/output circuit in accordance with the present embodiment may independently control the voltage levels of the first and second setup nodes SN1 and SN2 in the precharging operation time interval T1. In the loading and output operation time interval T2, the input/output circuit may quickly compare and amplify the first and second setup nodes SN1 and SN2 based on the differential input data DQ and DQB. As a result, the input/output circuit may include the precharging operation time interval T1, thereby raising the operation speed of the input/output circuit.

The input/output circuit in accordance with the present embodiment may include a clock generation circuit for adjusting the duty rate of the data strobe clock DQS. The clock generation circuit may be implemented as various embodiments, and one example will be described in more detail with reference to FIG. 6. When the duty rate of the data strobe clock DQS can be adjusted, it indicates that the precharging operation time interval T1 and the loading and output operation time interval T2 can be adjusted. Therefore, the input/output circuit may include a clock generation circuit to secure the sufficient precharging operation time interval T1.

The primary output signal OUT that corresponds to the first amplification node LN1 and the secondary output signal OUTS that corresponds to the second amplification node LN2 in FIGS. 1 and 3 may be outputted as final data through an output circuit which will be described below.

Figure 5:
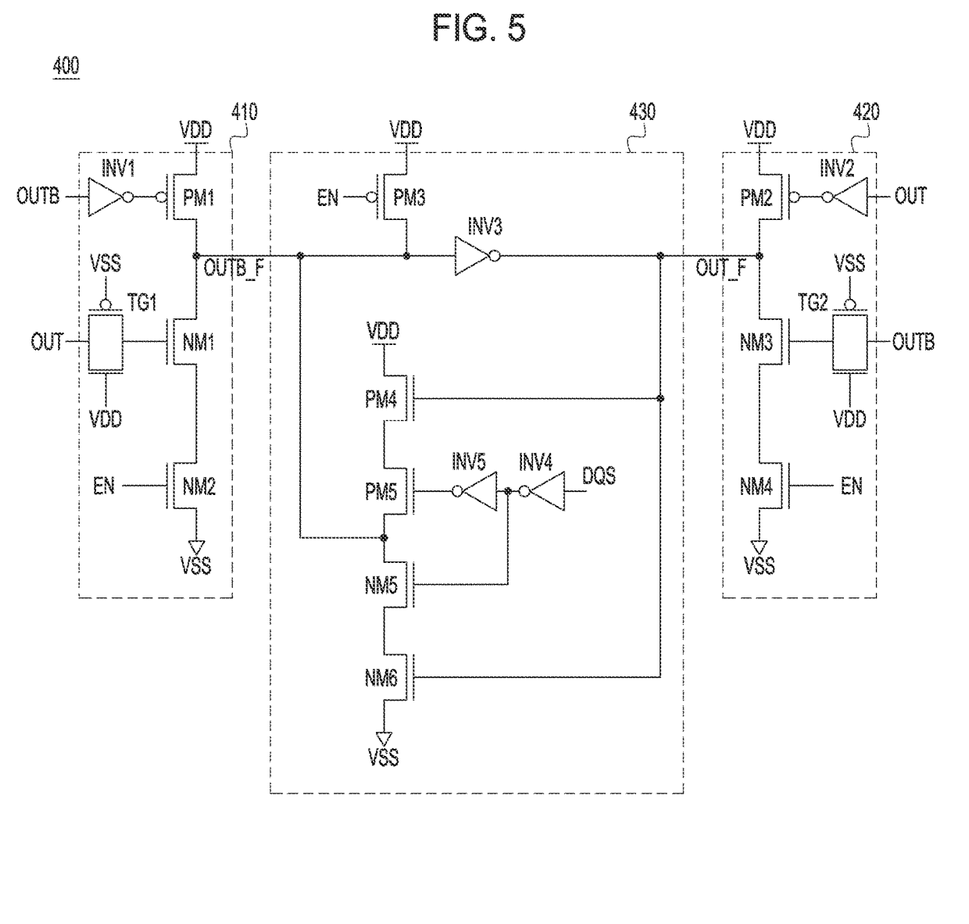
FIG. 5 is a circuit diagram illustrating a configuration of an output circuit.

FIG. 5 is a circuit diagram illustrating a configuration of an output circuit. For convenience of description, the output circuit will be represented by "400".

Referring to FIG. 5, the output circuit 400 may be configured to receive an output signal of the amplifier circuit 200 of FIG. 1, and generate a final output signal. The output circuit 400 may include first and second output circuits 410 and 420. The first output circuit 410 may generate a final secondary output signal OUTB_F that corresponds to the secondary output signal OUTB, which is an output signal of the amplifier circuit 200, The second output circuit 420 may generate a final primary output signal OUT_F that corresponds to the primary output signal OUT of the amplifier circuit 200.

First, the first output circuit 410 will be described in more detail as follows. The first output circuit 410 may include a first inverter INV1, a first transmission gate TG1, a first PMOS transistor PM1, a first NMOS transistor NM1, and a second NMOS transistor NM2.

The first inverter INV1 may receive the secondary output signal OUTB, invert the received signal, and output the inverted signal. The first transmission gate TG1 may receive the primary output signal OUT and output the received signal. The first transmission gate TG1 may include PMOS and NMOS transistors. The first transmission gate TG1 may be configured to adjust the signal delay time based on the first inverter INV1. The first PMOS transistor PM1, the first NMOS transistor NM1, and the second NMOS transistor NM2 may be coupled in series between the supply voltage terminal VDD and the ground voltage terminal VSS. The first PMOS transistor PM1 may have a gate terminal configured to receive an output signal of the first inverter INV1. The first NMOS transistor NM1 may have a gate terminal configured to receive an output signal of the first transmission gate TG1. The second NMOS transistor NM2 may have a gate terminal configured to receive an enable signal EN. The enable signal EN may be a signal for controlling whether to enable the input/output circuit. The final secondary output signal OUTB_F may be generated from a node to which the first PMOS transistor PM1 and the first NMOS transistor NM1 are commonly coupled.

Then, the second output circuit 420 will be described in more detail as follows. The second output circuit 420 may include a second inverter INV2, a second transmission gate TG2, a second PMOS transistor PM2, a third NMOS transistor NM3, and a fourth NMOS transistor NM4.

The second inverter INV2 may receive the primary output signal OUT, invert the received signal, and output the inverted signal. The second transmission gate TG2 may receive the secondary output signal OUTB and output the received signal. The second PMOS transistor PM2, the third NMOS transistor NM3 and the fourth NMOS transistor NM4 may be coupled in series between the supply voltage terminal VDD and the ground voltage terminal VSS. The second PMOS transistor PM2 may have a gate terminal configured to receive an output signal of the second inverter INV2. The third NMOS transistor NM3 may have a gate terminal configured to receive an output signal of the second transmission gate TG2. The fourth NMOS transistor NM4 may have a gate terminal configured to receive the enable signal EN. The final primary output signal OUT_F may be generated from a node to which the second PMOS transistor PM2 and the third NMOS transistor NM3 are coupled in common.

Through the above-described configuration, the output circuit 400 may generate the final primary output signal OUT_F and the final secondary output signal OUTB_F based on the primary output signal OUT and the secondary output signal OUTB.

The input/output circuit, in accordance with the present embodiment, may include a latching circuit 430.

The latching circuit 430 may be configured to latch the final primary output signal OUT_F and the final secondary output signal OUTB_F based on the data strobe clock DQS. The latching circuit 430 may latch the final primary output signal OUT_F and the final secondary output signal OUTB_F in a time interval in which the enable signal EN is logic 'low' and the data strobe clock DQS is logic 'high'.

More specifically, the latching circuit 430 may include a third PMOS transistor PM3, third to fifth inverters INV3 to INV5, fourth and fifth PMOS transistors PM4 and PM5, and fifth and sixth NMOS transistors NM5 and NM6.

The third PMOS transistor PM3 may have source and drain terminals that are coupled between the supply voltage terminal VDD and an output terminal of the final secondary output signal OUTB_F, and the third PMOS transistor PM3 may also have a gate terminal configured to receive the enable signal EN. Based on the enable signal EN, the third PMOS transistor PM3 may be configured to reset the output terminal of the final secondary output signal OUTB_F and an output terminal of the final primary output signal OUT_F. The third inverter INV3 may receive the final secondary output signal OUTB_F, invert the received signal, and output the inverted signal as the final primary output signal OUT_F. The fourth inverter INV4 may receive the data strobe clock DQS, invert the received signal, and output the inverted signal. The fifth inverter INV5 may receive the output signal of the fourth inverter INV4, invert the received signal, and output the inverted signal. The fourth and fifth PMOS transistors PM4 and PM5 and the fifth and sixth NMOS transistors NM5 and NM6 may be coupled in series between the supply voltage terminal VDD and the ground voltage terminal VSS. The fourth PMOS transistor PM4 may have a gate terminal configured to receive the final primary output signal OUT_F. The fifth PMOS transistor PM5 may have a gate terminal configured to receive an output signal of the fifth inverter INV5. The fifth NMOS transistor NM5 may have a gate terminal configured to receive an output signal of the fourth inverter INV4. The sixth NMOS transistor NM6 may have a gate terminal configured to receive the final primary output signal OUT_F.

Through the above-described configuration, the latching circuit 430 may reset the final secondary output signal OUTB_F to logic 'high' and reset the final primary output signal OUT_F to logic 'low', based on the logic 'low' enable signal EN. Furthermore, the latching circuit 430 may latch the final primary/secondary output signals OUT_F and OUTB_F that correspond to the primary/secondary output signals OUT and OUTB based on the logic 'low' data strobe clock DQS.

Figure 6:
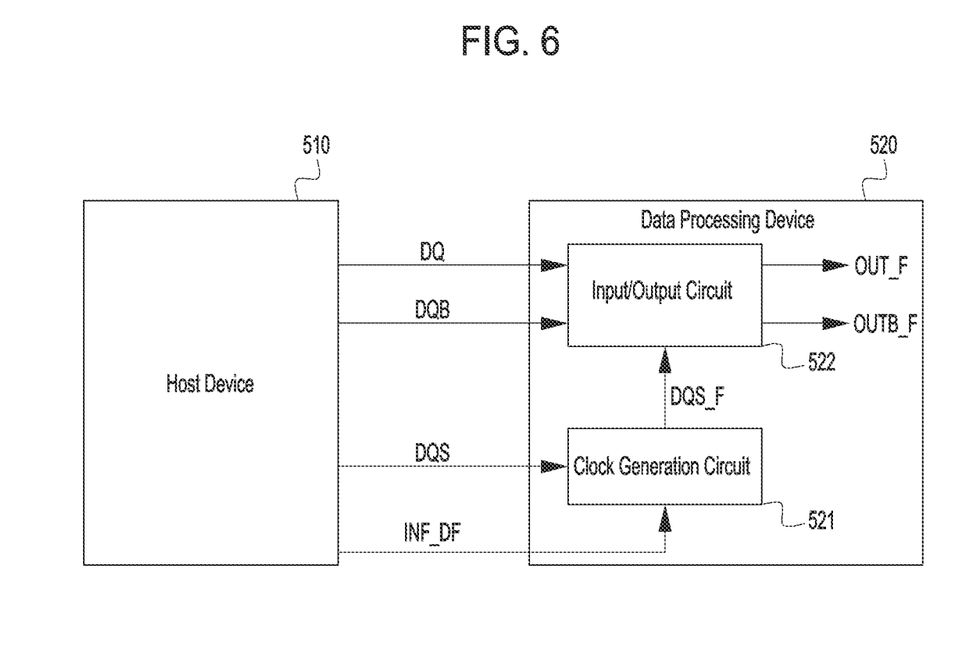
FIG. 6 is a block diagram illustrating a configuration of a data processing system in accordance with an embodiment.

FIG. 6 is a block diagram illustrating a configuration of a data processing system in accordance with an embodiment.

Referring to FIG. 6, the data processing system may include a host device 510 and a data processing device 520.

First, the host device 510 may be configured to provide differential input data DQ and DQB and data frequency information INF_DF. The data frequency information INF_DF may have information that corresponds to the period in which the differential input data DQ and DQB are inputted, i.e. the input frequency of the data. FIG. 6 illustrates an example in which the data strobe clock DQS is provided by the host device 510. The data strobe clock DQS may be generated in the data processing device 520 as well as the host device 510.

The data processing device 520 may be configured to input/output the differential input data DQ and DQB based on the data strobe clock DQS with a duty rate that corresponds to the data frequency information INF_DF.

More specifically, the data processing device 520 may include a clock generation circuit 521 and an input/output circuit 522.

The clock generation circuit 521 may be configured to adjust the duty rate of the data strobe clock DQS based on the data frequency information INF_DF. The clock generation circuit 521 may generate a final data strobe clock DQS_F by adjusting the duty rate of the data strobe clock DQS.

The input/output circuit 522 may be configured to input/output the differential input data DQ and DQB based on the final data strobe clock DQS_F. The input/output circuit 522 may generate the final primary output signal OUT_F that corresponds to the primary input data DQ and the final secondary output signal OUTB_F that corresponds to the secondary input data DQB. Since the configuration and operation of the input/output circuit 522 have already been described in detail with reference to FIGS. 1 to 5, the detailed descriptions thereof will be omitted herein.

Figure 7:
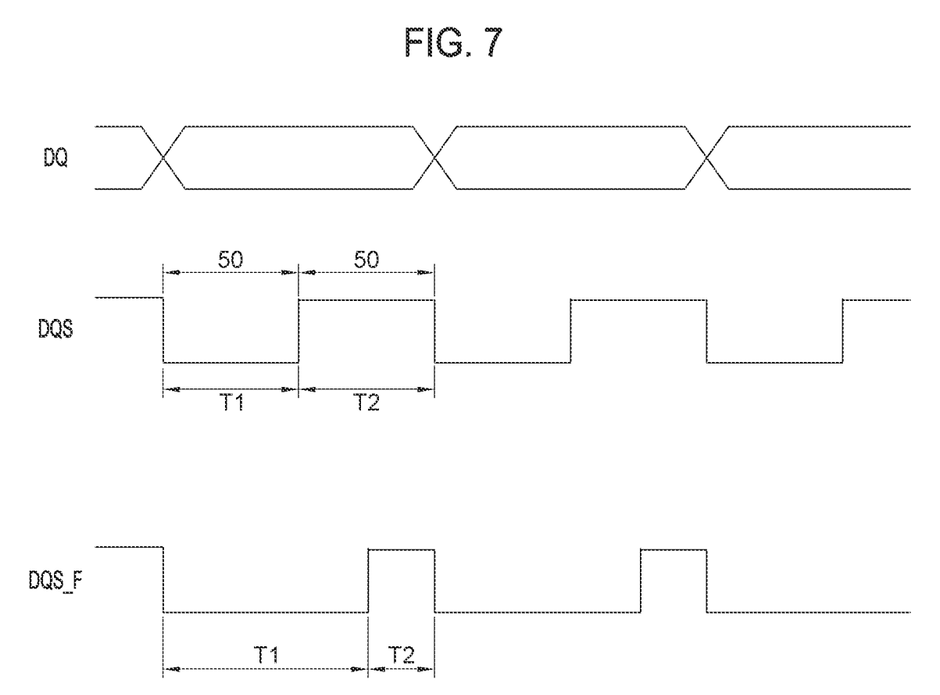
FIG. 7 is a diagram illustrating a control operation of the data processing system of FIG. 6.

FIG. 7 is a diagram illustrating a control operation of the data processing system of FIG. 6.

FIG. 7 illustrates the operation waveforms of the primary input data DQ, the data strobe clock DQS, and the final data strobe clock DQS_F. In FIG. 7, "T1" is defined as "precharging operation time interval", and "T2" is defined as "loading and output operation time interval", as in FIG. 4.

Referring to FIGS. 6 and 7, the host device 510 may provide the differential input data DQ and DQB, the data strobe clock DQS and the data frequency information INF_DF to the data processing device 520. At this time, suppose that the duty rate of the data strobe clock DQS is 50:50. Furthermore, suppose that the differential input data DQ and DQB are inputted in a relatively long period, i.e. at a relatively low frequency. In such a case, the data frequency information INF_DF may have information that indicates that the differential input data DQ and DQB are inputted at a low frequency. The data frequency information INF_DF may be designed to include information that is higher than the preset frequency and information that is lower than the preset frequency, using one logic level. The data frequency information INF_DF may be designed to include information that corresponds to a plurality of frequencies through two or more code signals.

The clock generation circuit 521 may generate a final data strobe clock DQS_F by adjusting the duty rate of the data strobe clock DQS based on the data frequency information INF_DF. As illustrated in FIG. 7, the duty rate of the final data strobe clock DQS_F may be different from the duty rate of the data strobe clock DQS. The precharging operation time interval T1 that is defined by the final data strobe clock DQS_F may be longer than the loading and output operation time interval T2. When the precharging operation time interval T1 is long, it indicates that the time that is required to perform the precharging operation may be sufficiently secured.

The data processing system, in accordance with the present embodiment, may adjust the precharging operation time interval based on the frequency at which the differential input data DQ and DQB are inputted. Therefore, the data processing system may input/output the differential input data DQ and DQB more stably.

While various embodiments have been described above, it will be understood to those skilled in the art that the embodiments described are examples only. Accordingly, the operating method of a data storage device described herein should not be limited based on the described embodiments.

What is claimed is:

1. An input/output circuit comprising:
a clock generation circuit configured to adjust a duty rate of a data strobe clock;
an input circuit configured to load differential input data to setup nodes based on the data strobe clock;
an amplifier circuit configured to compare and amplify the data that is loaded to the setup nodes and configured to output the amplified data; and
a precharging circuit configured to precharge the setup nodes based on the data strobe clock and the differential input data.

2. The input/output circuit according to claim 1,
wherein the setup nodes comprise a first setup node and a second setup node, and
wherein the input circuit loads a primary input data that is included in the differential input data to the first setup node, and loads a secondary input data that is included in the differential input data to the second setup node.

3. The input/output circuit according to claim 2, wherein the precharging circuit comprises:
a first precharging circuit configured to precharge the first setup node based on the data strobe clock and the primary input data; and
a second precharging circuit configured to precharge the second setup node based on the data strobe clock and the secondary input data.

4. The input/output circuit according to claim 2, wherein the precharging circuit comprises:
a voltage supply circuit configured to provide a precharging voltage based on the data strobe clock;
a first precharging circuit configured to receive the precharging voltage and configured to precharge the first setup node based on the primary input data; and
a second precharging circuit configured to receive the precharging voltage and configured to precharge the second setup node based on the secondary input data.

5. The input/output circuit according to claim 1, further comprising an output circuit configured to receive the output signal of the amplifier circuit and generate a final output signal.

6. The input/output circuit according to claim 5, wherein the differential input data comprise a primary input data and a secondary input data, and the amplifier circuit outputs a primary output signal that corresponds to the primary input data and a secondary output signal that corresponds to the secondary input data,
wherein the output circuit comprises:
a first output circuit configured to generate a final secondary output signal that corresponds to the secondary output signal; and
a second output circuit configured to generate a final primary output signal that corresponds to the primary output signal.

7. The input/output circuit according to claim 6, further comprising a latching circuit configured to latch the final primary output signal and the final secondary output signal based on the data strobe clock.

8. The input/output circuit according to claim 1,
wherein the clock generation circuit is configured to adjust the duty rate of the data strobe clock based on an input frequency of the differential input data.

9. An operation method of an input/output circuit, comprising the steps of:
precharging a first setup node and a second setup node to different voltage levels from each other based on differential input data during a precharging operation;
loading the differential input data to the first and second setup nodes precharged to the different voltage levels, during a loading operation; and
comparing and amplifying the data of the first and second setup nodes and outputting the amplified data during an output operation,
wherein the step of precharging the first and second setup nodes comprises:
precharging the first setup node based on a data strobe clock and a primary input data that is included in the differential input data; and
precharging the second setup node based on the data strobe clock and a secondary input data that is included in the differential input data.

10. The operation method according to claim 9, further comprising a step of adjusting a duty rate of the data strobe clock before the step of precharging the first and second setup nodes.

11. The operation method according to claim 9,
wherein the step of adjusting the duty rate comprises a step of adjusting the duty rate of the data strobe clock based on the input frequency of the differential input data.

12. A data processing system comprising:
a host device configured to provide differential input data and data frequency information; and
a data processing device configured to input and output the differential input data based on a data strobe clock with a duty rate that corresponds to the data frequency information,
wherein the data processing device comprises:
a clock generation circuit configured to adjust the duty rate of the data strobe clock and generate a final data strobe clock based on the data frequency information; and
an input/output circuit comprising an input circuit configured to load the differential input data to setup nodes based on the final data strobe clock, an amplifier circuit configured to amplify the data that is loaded to the setup nodes and configured to output the amplified data, and a precharging circuit configured to precharge the setup nodes based on the final data strobe clock and the differential input data.

13. The data processing system according to claim 12,
wherein the setup nodes comprise a first setup node and a second setup node, and
wherein the input circuit loads a primary input data that is included in the differential input data to the first setup node, and loads a secondary input data that is included in the differential input data to the second setup node.

14. The data processing system according to claim 13, wherein the precharging circuit comprises:
a first precharging circuit configured to precharge the first setup node based on the final data strobe clock and the primary input data; and
a second precharging circuit configured to precharge the second setup node based on the final data strobe clock and the secondary input data.

15. The data processing system according to claim 13, wherein the precharging circuit comprises:
a first precharging circuit configured to precharge the first setup node based on the primary input data;
a second precharging circuit configured to precharge the second setup node based on the secondary input data; and
a voltage supply circuit configured to provide a precharging voltage to the first and second precharging circuits based on the final data strobe clock, wherein the voltage supply circuit is commonly coupled to the first and second precharging circuits.

16. The data processing system according to claim 12, further comprising an output circuit configured to receive an output signal of the amplifier circuit and generate a final output signal.

17. The data processing system according to claim 16, wherein the differential input data comprise a primary input data and a secondary input data, and the amplifier circuit outputs a primary output signal that corresponds to the primary input data and a secondary output signal that corresponds to the secondary input data, wherein the output circuit comprises:
- a first output circuit configured to generate a final secondary output signal that corresponds to the secondary output signal; and
- a second output circuit configured to generate a final primary output signal that corresponds to the primary output signal.

18. The data processing system according to claim 17, further comprising a latching circuit configured to latch the final primary output signal and the final secondary output signal based on the data strobe clock.

* * * * *